(12) United States Patent
Lee et al.

(10) Patent No.: US 8,692,459 B2
(45) Date of Patent: Apr. 8, 2014

(54) ORGANIC LIGHT-EMITTING DISPLAY APPARATUS AND METHOD OF MANUFACTURING THE ORGANIC LIGHT-EMITTING DISPLAY APPARATUS

(75) Inventors: Dae-Woo Lee, Yongin (KR); Soo-Beom Jo, Yongin (KR); Jong-Hyun Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 72 days.

(21) Appl. No.: 13/306,010

(22) Filed: Nov. 29, 2011

(65) Prior Publication Data

US 2013/0009542 A1   Jan. 10, 2013

(30) Foreign Application Priority Data

Jul. 4, 2011  (KR) .................. 10-2011-0066122

(51) Int. Cl.
  *H01L 51/50* (2006.01)
  *G09G 3/10* (2006.01)
(52) U.S. Cl.
  USPC ............. 313/506; 313/504; 257/40; 257/89
(58) Field of Classification Search
  USPC ................................................. 313/504–512
  See application file for complete search history.

(56) References Cited

U.S. PATENT DOCUMENTS

| 7,666,247 | B2 | 2/2010 | He et al. | |
| 7,812,523 | B2 * | 10/2010 | Jung et al. | 313/506 |
| 2007/0114523 | A1 * | 5/2007 | Oumi et al. | 257/40 |
| 2009/0128014 | A1 * | 5/2009 | Kitazume | 313/504 |
| 2011/0042694 | A1 * | 2/2011 | Oyamada | 257/88 |
| 2011/0187264 | A1 * | 8/2011 | Yasuda et al. | 313/504 |
| 2012/0080668 | A1 * | 4/2012 | Seki | 257/40 |

FOREIGN PATENT DOCUMENTS

| JP | 2010238775 A | * 10/2010 |
| KR | 10-2006-0089214 A | 8/2006 |
| KR | 10-2007-0063067 A | 6/2007 |
| KR | 10-2007-0068092 A | 6/2007 |
| KR | 10-2008-0003314 | 1/2008 |

OTHER PUBLICATIONS

Machine English transaltion of JP2010238775 to Yasuda et al.*
"Enhanced Fluorescence by surface plasmon coupling ofAu nanoparticles in an organic Electroluminescence Diode", Fujiki et al. Applied Physics Letters, vol. 96, pp. 043307-1-043307-3, 2010.*
Jong-Min Moon et al., Enhancement of Hole Injection Using Ozone Treated Ag Nanodots Dispersed on Indium, etc., Appl. Physics Letters 90, 163516-1, 2007.

* cited by examiner

*Primary Examiner* — Sikha Roy
(74) *Attorney, Agent, or Firm* — Lee & Morse, P.C.

(57) ABSTRACT

An organic light-emitting display apparatus includes a substrate; a first electrode on the substrate; a particle unit including a plurality of particles that are separate from each other on a top surface of the first electrode; an intermediate layer on the first electrode and the particle unit and including an organic emission layer; and a second electrode on the intermediate layer.

10 Claims, 4 Drawing Sheets

ORGANIC LIGHT-EMITTING DISPLAY APPARATUS AND METHOD OF MANUFACTURING THE ORGANIC LIGHT-EMITTING DISPLAY APPARATUS

CROSS-REFERENCE TO RELATED PATENT APPLICATION

This application claims the benefit of Korean Patent Application No. 10-2011-0066122, filed on Jul. 4, 2011, in the Korean Intellectual Property Office, the disclosure of which is incorporated herein in its entirety by reference.

BACKGROUND

1. Field

Embodiments relate to an organic light-emitting display apparatus and method of manufacturing the organic light-emitting display apparatus.

2. Description of the Related Art

Recently, display apparatuses are being replaced with portable, thin flat panel display apparatuses. Among the flat panel display apparatuses, organic light-emitting display apparatuses are self-emissive display apparatuses that have wide viewing angles and an excellent contrast ratio, and high response speeds, and thus are regarded as next-generation display apparatuses.

SUMMARY

According to an embodiment, there is provided an organic light-emitting display apparatus, including a substrate, a first electrode on the substrate, a particle unit including a plurality of particles that are separate from each other on a top surface of the first electrode, an intermediate layer on the first electrode and the particle unit, the intermediate layer including an organic emission layer, and a second electrode on the intermediate layer.

A size of the particles of the particle unit may be from about 300 angstroms to about 1000 angstroms.

The particles of the particle unit may include Ag.

The organic light-emitting display apparatus may further include a pixel defining layer (PDL) on the first electrode, the pixel defining layer including an opening that overlaps with the first electrode. The particle unit may further include particles on an inner portion and an outer portion of the opening of the PDL.

The first electrode may include a transmissive conductive material.

The transmissive conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The second electrode may contact predetermined particles from among the plurality of particles of the particle unit.

The predetermined particles may not correspond to the intermediate layer.

According to an embodiment, there is provided a method of manufacturing an organic light-emitting display apparatus, the method including forming a first electrode on a substrate, forming a particle unit including a plurality of particles that are separate from each other on a top surface of the first electrode, forming an intermediate layer including an organic emission layer on the first electrode and the particle unit, and forming a second electrode on the intermediate layer.

The forming of the particle unit may include forming a conductive layer that includes Ag, and performing a thermal treatment on the conductive layer so as to allow the Ag to agglomerate.

A thickness of the conductive layer may be about 10 angstroms to about 200 angstroms.

The thermal treatment may be performed in a nitrogen atmosphere.

The thermal treatment may be performed at a temperature in a range of about 250 degrees Celsius to about 300 degrees Celsius.

After the forming of the first electrode and before the forming of the particle unit, the method may further include forming a pixel defining layer (PDL) on the first electrode, wherein the PDL includes an opening that overlaps with the first electrode.

The particle unit may be additionally formed on an inner portion and an outer portion of the opening of the PDL.

The forming of the particle unit may include forming a conductive layer including Ag on the first electrode and the PDL, and performing a thermal treatment on the conductive layer so as to allow the Ag to agglomerate.

BRIEF DESCRIPTION OF THE DRAWINGS

The above and other features and advantages will become more apparent by describing in detail exemplary embodiments thereof with reference to the attached drawings in which.

DETAILED DESCRIPTION

Hereinafter, the embodiments will be described in detail by explaining exemplary embodiments with reference to the attached drawings.

As used herein, the term "and/or" includes any and all combinations of one or more of the associated listed items.

Figure 1:
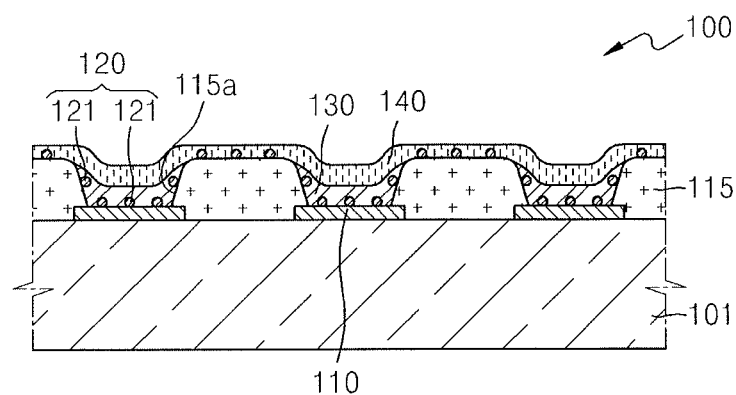
FIG. 1 is a schematic cross-sectional view illustrating an organic light-emitting display apparatus according to an embodiment.

FIG. 1 is a schematic cross-sectional view illustrating an organic light-emitting display apparatus 100 according to an embodiment.

Referring to FIG. 1, the organic light-emitting display apparatus 100 may include a substrate 101, a first electrode 110, a particle unit 120, an intermediate layer 130, and a second electrode 140. The particle unit 120 may include a plurality of particles 121 that are separate from each other.

The substrate 101 may be formed of a transparent glass containing $SiO_2$ as a main component. The substrate 101 may also be formed of a transparent plastic material that may be at least one insulating organic material selected from polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetate cellulose (TAC), and cellulose acetate propionate (CAP).

Also, the substrate 101 may be formed of metal or may have a foil shape.

The first electrode 110 may be disposed on portions of the substrate 101. The first electrode 110 may be patterned by a photolithography method. Although not illustrated in FIG. 1, a buffer layer (not shown) may be formed between the substrate 101 and the first electrode 110. The buffer layer may provide a plane surface on the substrate 101 and may prevent penetration of foreign substances into the substrate 101. The buffer layer may be formed of $SiO_2$ and/or $SiN_x$.

The pattern of the first electrode 110 may be formed as stripe lines that are separate from each other by a predetermined distance. That is, the organic light-emitting display apparatus 100 according to the present embodiment may be a passive matrix (PM) type organic light-emitting display apparatus. An active matrix (AM) type organic light-emitting display apparatus will be described below.

The first electrode 110 may include one of various conductive materials. The first electrode 110 may include a transmissive conductive material. For example, the first electrode 110 may include at least one of indium tin oxide (ITO), indium zinc oxide (IZO), zinc oxide (ZnO), indium oxide ($In_2O_3$), indium gallium oxide (IGO), and aluminum zinc oxide (AZO).

A pixel defining layer (PDL) 115 may be disposed on the first electrode 110. The PDL 115 may include an opening 115a. The opening 115a may correspond to the first electrode 110. The PDL 115 may cover a side edge of the first electrode 110, and the opening 115a may overlap with a predetermined region of a top surface of the first electrode 110. The PDL 115 may be formed of by using one of various insulating materials.

The particle unit 120 may be disposed to contact the top surface of the first electrode 110. The particle unit 120 may include a plurality of particles 121. Each of the particles 121 may include Ag. The particles 121 may be formed not only on the top surface of the first electrode 110 but also on a top portion of the PDL 115.

The particles 121 of the particle unit 120 may have a predetermined size from about 300 angstroms to about 1000 angstroms.

In a case where a size of the particle 121 is less than 300 angstroms, visible light that is emitted from the intermediate layer 130 and transmitted toward the particle unit 120 may not be effectively dispersed and reflected such that a luminescent efficiency of the organic light-emitting display apparatus 100 may be poor.

Visible light emitted from the intermediate layer 130 may be dispersed by each of the particles 121 of the particle unit 120, so that light of the visible light emitted from the intermediate layer 130 and having a specific wavelength may be filtered. Also, the visible light emitted from the intermediate layer 130 may be reflected between the particle unit 120 and the second electrode 140, so that an optical resonance effect occurs in a space between the particle unit 120 and the second electrode 140. If the size of the particles 121 is less than 300 angstroms, effective reflection and dispersion may not occur. It is desirable that the size of the particles 121 be equal to or greater than 300 angstroms.

In a case where the size of the particles 121 is greater than 1000 angstroms, the transmittance of the visible light that is emitted from the intermediate layer 130 and transmitted toward the substrate 101 may be decreased. In the case of a bottom emission type organic light emitting display apparatus 100, in which visible light emitted from the intermediate layer 130 is transmitted toward the substrate 101 by which a user recognizes the visible light, if the size of the particles 121 is greater than 1000 angstroms, the transmittance of the visible light emitted from the intermediate layer 130 may be decreased by the particles 121. Thus, it is desirable that the size of the particles 121 be equal to or less than 1000 angstroms.

Here, the term "size of the particles 121" may refer to a width of each of the particles 121. For example, in a case where each of the particles 121 has a spherical shape, the size of the particles 121 may be defined as a diameter. In a case where each of the particles 121 is not spherical, a largest width of the particle 121 may be defined as the size of the particle 121, provided that the size of the particle 121 is measured with respect to a center of the particle 121.

The intermediate layer 130 may be disposed on the particle unit 120. The intermediate layer 130 may include an organic emission layer. In more detail, the intermediate layer 130 may be disposed to correspond to the opening 115a of the PDL 115. The intermediate layer 130 may be disposed on the particles 121 of the particle unit 120, and may contact the first electrode 110 via a space between the particles 121 that are separate from each other.

The organic emission layer of the intermediate layer 130 emits visible light and may produce various colors. For example, the organic emission layer may emit visible light of red, green, and blue colors.

The second electrode 140 may be disposed on the intermediate layer 130. The second electrode 140 may have a stripe pattern that is perpendicular to the pattern of the first electrode 110. The second electrode 140 may be formed of one or more of Ag, Mg, Al, Pt, Pd, Au, Ni, Nd, Ir, Cr, Li, Ca or a compound thereof.

The second electrode 140 may contact the particles 121 of the particle unit 120. That is, the second electrode 140 may contact predetermined particles 121 from among the particles 121 that do not correspond to the intermediate layer 130. Because the second electrode 140 may contact the particles 121 including Ag, it may be possible to prevent an IR drop in the second electrode 140 that may occur when a voltage is applied to the second electrode 140 and when the organic light-emitting display apparatus 100 is large.

Although not illustrated in FIG. 1, a sealing member (not shown) may be formed on the second electrode 140 so as to face one surface of the substrate 101. The sealing member may be formed to protect the intermediate layers 130 from water or oxygen from outside. The sealing member may be formed of glass or plastic or may have a structure in which a plurality of organic and inorganic materials is stacked.

The organic light-emitting display apparatus 100 may include the particle unit 120. A part of visible light which is emitted from the intermediate layers 130 of the organic light-emitting display apparatus 100 and which is transmitted toward the substrate 101 may reach the particle unit 120 and then may be reflected from the particle unit 120. The visible light that is reflected from the particle unit 120 may be transmitted toward the second electrode 140 and then may be reflected from the second electrode 140. In this process, the visible light may resonate in a space between the particle unit 120 and the second electrode 140, and the optical resonance may improve a luminescent efficiency of the organic light-emitting display apparatus 100. Accordingly, a display quality of the organic light-emitting display apparatus 100 may be improved.

In particular, the luminescent efficiency of the organic light-emitting display apparatus 100 may be further improved in the bottom emission type organic light emitting display apparatus 100 in which visible light emitted from the intermediate layer 130 is transmitted toward the substrate 101 by which a user recognizes the visible light. The particle unit 120 does not include an extended thin layer, but may include the particles 121 that are separate from each other, so that, after the resonance, visible light is transmitted toward the substrate 101 via a space between the particles 121 and then reaches a user, and thus optical loss may be decreased.

Also, visible light emitted from the intermediate layer 130 may reach the particle unit 120 and then may be dispersed by the particles 121. Due to the optical dispersion, the luminescent efficiency of the organic light-emitting display apparatus 100 may be improved. In particular, the optical dispersion may induce filtering on a specific wavelength of the visible light. Due to this, a luminescent quality of blue visible light emitted from the intermediate layer 130 may be easily improved, and accordingly, the display quality of the organic light-emitting display apparatus 100 may be improved.

Also, because the second electrode 140 contacts the particles 121, a voltage drop of the second electrode 140 may be prevented, so that an electrical characteristic and the display quality of the organic light-emitting display apparatus 100 may be improved.

Figure 2:
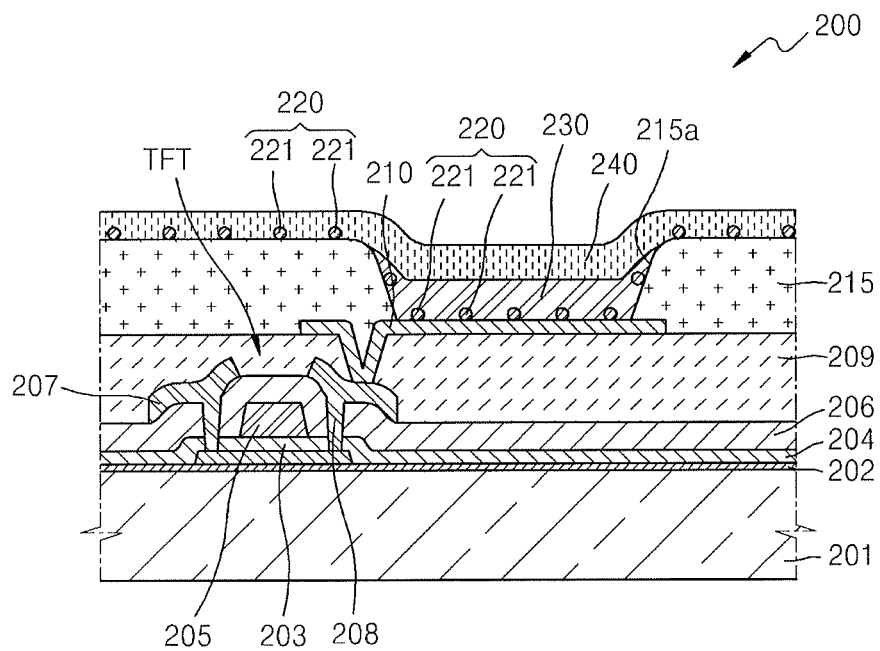
FIG. 2 is a schematic cross-sectional view illustrating an organic light-emitting display apparatus according to another embodiment.

FIG. 2 is a schematic cross-sectional view illustrating an organic light-emitting display apparatus 200 according to another embodiment.

Referring to FIG. 2, the organic light-emitting display apparatus 200 may include a substrate 201, a thin film transistor (TFT), a first electrode 210, a particle unit 220, an intermediate layer 230, and a second electrode 240. The TFT may include an active layer 203, a gate electrode 205, a source electrode 207, and a drain electrode 208.

A configuration of each member will now be described in detail.

A buffer layer 202 may be formed on the substrate 201. The buffer layer 202 may be formed of $SiO_2$ or $SiN_x$. Also, the buffer layer 202 may have a structure in which a plurality of layers is stacked. The buffer layer 202 may provide a plane surface on the substrate 201 and may prevent penetration of water and foreign substances into the substrate 201.

The active layer 203, which has a predetermined pattern, may be formed on the buffer layer 202. The active layer 203 may be formed of an inorganic semiconductor including amorphous silicon or polysilicon, or an organic semiconductor. The active layer 203 may include a source region and a drain region. A gate insulating layer 204 may be formed on the active layer 203. The gate insulating layer 204 may be formed using various insulating materials.

The gate electrode 205 may be formed on a predetermined region of the gate insulating layer 204. The gate electrode 205 may be connected to a gate line (not shown) that applies TFT ON/OFF signals to the TFT. The gate electrode 205 may be formed of a metal including Au, Ag, Cu, Ni, Pt, Pd, Al, or Mo, or a metal alloy including an Al:Nd alloy, a Mo:W alloy, or the like, as examples.

An interlayer insulating layer 206 may be formed on the gate electrode 205 and may expose the source and drain regions of the active layer 203.

The source electrode 207 and the drain electrode 208 may be formed to respectively contact the exposed source and drain regions of the active layer 203.

A passivation layer 209 may be formed on the interlayer insulating layer 206 to cover the TFT.

The first electrode 210 may be formed on the passivation layer 209. The passivation layer 209 may be formed to expose the drain electrode 208, and the first electrode 210 may be connected to the exposed drain electrode 208

The first electrode 210 may include at least one of ITO, IZO, ZnO, $In_2O_3$, IGO, and AZO.

A PDL 215 may be disposed on the first electrode 210. The PDL 215 may be formed of one of various insulating materials and may include an opening 215a. The opening 215a may correspond to the first electrode 210. The opening 215a may overlap with a predetermined region of a top surface of the first electrode 210.

The particle unit 220 may be disposed to contact the top surface of the first electrode 210. The particle unit 220 may include a plurality of particles 221. Each of the particles 221 may include Ag. The particles 221 may be formed on the top surface of the first electrode 210 and on a top portion of the PDL 215.

The particles 221 of the particle unit 220 may have a predetermined size that is from about 300 angstrom to about 1000 angstrom. A detailed description regarding a configuration of each particle 221 may be the same as the previous embodiment, and thus, is not repeated here.

The intermediate layer 230 may be disposed on the particle unit 220. The intermediate layer 230 may include an organic emission layer. In more detail, the intermediate layer 230 may be disposed to correspond to the opening 215a of the PDL 215. The intermediate layer 230 may be disposed on the particles 221 of the particle unit 220, and contacts the first electrode 210 via a space between the particles 221 that are separate from each other.

The organic emission layer of the intermediate layer 230 emits visible light and may produce various colors. For example, the organic emission layer may emit visible light of red, green, and blue colors.

The second electrode 240 may be disposed on the intermediate layer 230. The second electrode 240 may not have a specific pattern and may be commonly formed on all sub-pixels (not shown). The second electrode 240 may be formed of one or more of Ag, Mg, Al, Pt, Pd, Au, Ni, Nd, Ir, Cr, Li, Ca, or a compound thereof.

Although not illustrated in FIG. 2, a sealing member (not shown) may be formed on the second electrode 240 so as to face one surface of the substrate 201. The sealing member may be formed to protect the intermediate layer 230 from water or oxygen from outside. The sealing member may be formed of glass or plastic or may have a structure in which a plurality of organic and inorganic materials is stacked.

Figure 3:
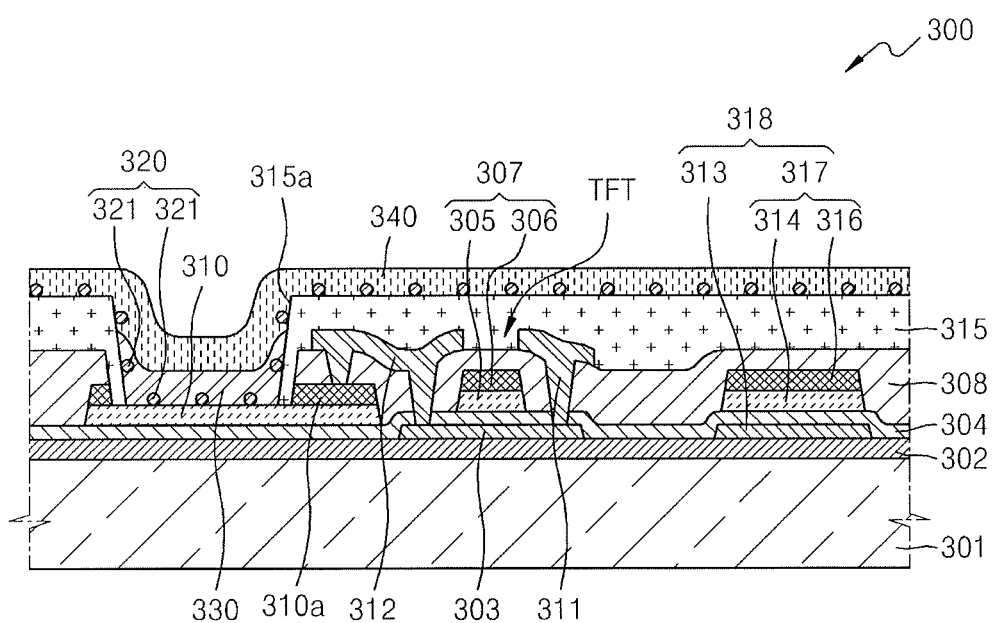
FIG. 3 is a schematic cross-sectional view illustrating an organic light-emitting display apparatus according to another embodiment.

FIG. 3 is a schematic cross-sectional view illustrating an organic light-emitting display apparatus 300 according to another embodiment.

Referring to FIG. 3, the organic light-emitting display apparatus 300 may include a substrate 301, a TFT, a first electrode 310, an intermediate layer 330, a second electrode 340, a particle unit 320, and a capacitor 318.

The TFT may include an active layer 303, a gate electrode 307, a source electrode 311, and a drain electrode 312. The capacitor 318 may include a first capacitor electrode 313 and a second capacitor electrode 317.

A buffer layer 302 may be formed on the substrate 301. The active layer 303 may be formed on a portion of the buffer layer 302. Also, the first capacitor electrode 313 may be formed on a portion of the buffer layer 302. The first capacitor electrode 313 may be formed of the same material as the active layer 303.

A gate insulating layer 304 may be formed on the buffer layer 302 so as to cover the active layer 303 and the first capacitor 313. The gate electrode 307, the first electrode 310, and the second capacitor electrode 317 may be formed on portions of the gate insulating layer 304.

The gate electrode 307 may include a first conductive layer 305 and a second conductive layer 306. The first conductive layer 305 may include a transmissive conductive material, and in more detail, the first conductive layer 305 may include at least one of ITO, IZO, ZnO, $In_2O_3$, IGO, and AZO. The second conductive layer 306 may be formed of a metal including Mo, or a metal alloy including a Mo:W alloy, an Al-based alloy, or the like, as examples.

The first electrode 310 may include a transmissive conductive material and may be formed of the same material as the first conductive layer 305 of the gate electrode 307. A conductive portion 310a may be disposed on a predetermined region of the first electrode 310 and may be formed of the same material as the second conductive layer 306 of the gate electrode 307.

The second capacitor electrode 317 may include a first layer 314 and a second layer 316. The first layer 314 of the second capacitor electrode 317 may be formed of the same material as the first conductive layer 305 of the gate electrode 307, and the second layer 316 of the second capacitor electrode 317 may be formed of the same material as the second conductive layer 306 of the gate electrode 307.

An interlayer insulating layer 308 may be formed on the first electrode 310, the gate electrode 307, and the second capacitor electrode 317. The interlayer insulating layer 308 may include various organic or inorganic insulating materials.

The source electrode 311 and the drain electrode 312 may be formed on the interlayer insulating layer 308. The source electrode 311 and the drain electrode 312 may be connected to the active layer 303 via the interlayer insulating layer 308 and the gate insulating layer 304.

Also, one of the source electrode 311 and the drain electrode 312 may be electrically connected to the first electrode 310. FIG. 3 corresponds to a case in which the drain electrode 312 is electrically connected to the first electrode 310. The drain electrode 312 may contact the conductive portion 310a.

A PDL 315 may be formed on the interlayer insulating layer 308 so as to cover the TFT and the capacitor 318. The PDL 315 may include an opening 315a. The opening 315a may overlap with a predetermined region of a top surface of the first electrode 310.

The particle unit 320 may be disposed to contact the top surface of the first electrode 310. The particle unit 320 may include a plurality of particles 321. Each of the particles 321 may include Ag. The particles 321 may be formed on the top surface of the first electrode 310 and on a top portion of the PDL 315.

The particles 321 of the particle unit 320 may have a predetermined size that is from about 300 angstrom to about 1000 angstrom. A detailed description regarding a configuration of each particle 321 may be the same as the previous embodiment, and thus, is not repeated here.

The intermediate layer 330 may be disposed on the particle unit 320. The intermediate layer 330 may include an organic emission layer. In more detail, the intermediate layer 330 may be disposed to correspond to the opening 315a of the PDL 315. The intermediate layer 330 may be disposed on the particles 321 of the particle unit 320, and contacts the first electrode 310 via a space between the particles 321 that are separate from each other.

The second electrode 340 may be disposed on the intermediate layer 330. When a voltage is applied to the intermediate layer 330 via the first electrode 310 and the second electrode 340, visible light may be emitted from the organic emission layer of the intermediate layer 330.

A sealing member (not shown) may be disposed on the second electrode 340. The sealing member may be formed to protect the intermediate layers 330 and other layers from water and oxygen from outside and may be formed of a transparent material. The sealing member may have a structure in which a glass, a plastic, or a plurality of organic and inorganic materials is stacked.

FIGS. 4A through 4F are cross-sectional views that sequentially illustrate a method of manufacturing an organic light-emitting display apparatus, according to an embodiment.

In particular, the present embodiment corresponds to a method of manufacturing the organic light-emitting display apparatus 100 of FIG. 1. Although not illustrated in FIGS. 4A through 4F, aspects of the method according to the present embodiment may also apply to a method of manufacturing the organic light-emitting display apparatuses 200 and 300 of FIGS. 2 and 3.

Figure 4A:
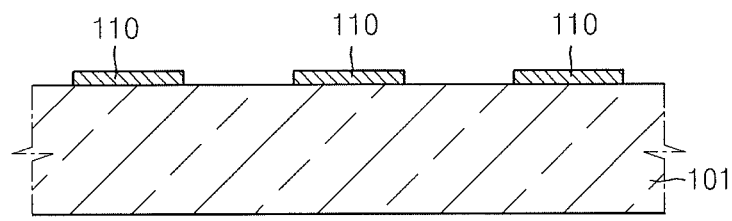
FIGS. 4A through 4F are cross-sectional views that sequentially illustrate a method of manufacturing an organic light-emitting display apparatus, according to an embodiment.

Referring to FIG. 4A, the first electrode 110 may be formed on portions of the substrate 101. The first electrode 110 may be formed by a photolithography method to have a predetermined pattern. Although not illustrated, a buffer layer (not shown) may be formed before the first electrode 110 is formed on the substrate 101.

The first electrode 110 may be formed of at least one conductive material selected from ITO, IZO, ZnO, $In_2O_3$, IGO, and AZO.

Figure 4B:
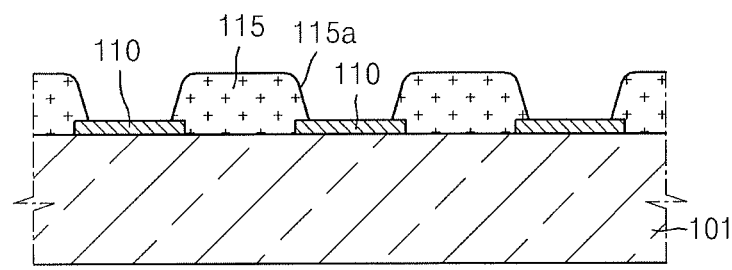

Referring to FIG. 4B, the PDL 115 may be formed on the first electrode 110. The PDL 115 may be formed to include the opening 115a, which has a predetermined pattern. The PDL 115 may include a polymer material.

The opening 115a may correspond to the first electrode 110. The PDL 115 may cover a side edge of the first electrode 110. The opening 115a may expose a predetermined region of a top surface of the first electrode 110.

Figure 4C:
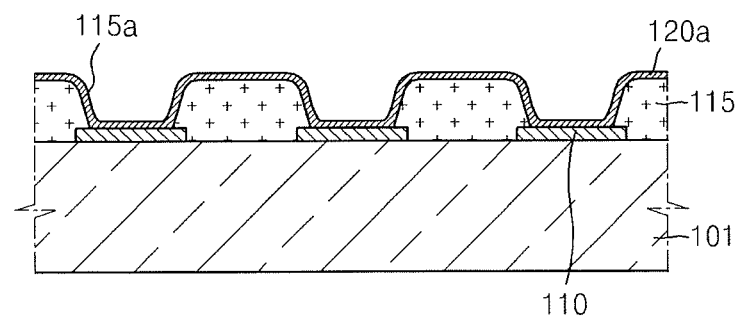

Referring to FIG. 4C, a conductive layer 120a to form the particle unit 120 may be formed on an exposed surface of the first electrode 110 and a top surface of the PDL 115. The conductive layer 120a may be formed on the first electrode 110 and the PDL 115 without using a separate pattern.

The conductive layer 120a may include Ag, and may have a predetermined thickness. The thickness of the conductive layer 120a may be about 10 angstroms to about 200 angstroms. When the conductive layer 120a is formed to have the predetermined thickness, the particles 121 may be formed to have a size in the range of about 300 angstroms to about 1000 angstroms by performing a thermal treatment process.

Figure 4D:
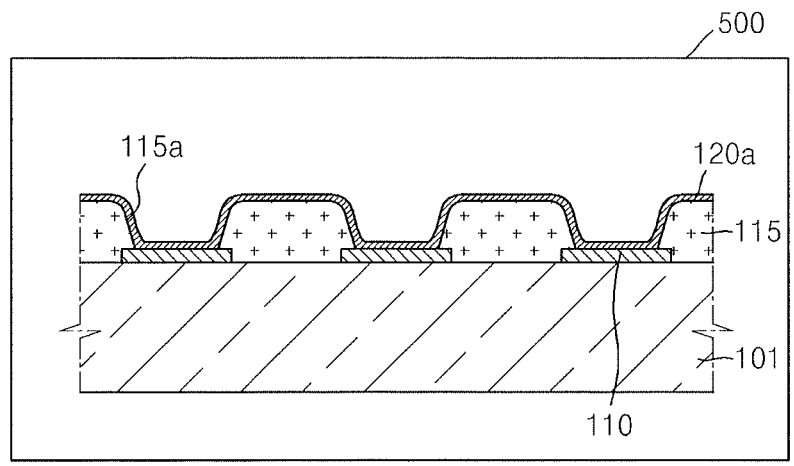

Referring to FIG. 4D, the thermal treatment process may be performed so that agglomeration occurs in the conductive layer 120a, and thus, the particles 121 may be formed. The thermal treatment process may be performed by inserting the substrate 101 into a thermal processing chamber 500. The thermal treatment process may be performed at a temperature in the range of about 250 degrees Celsius to about 300 degrees Celsius. For example, the thermal treatment process may be performed at a temperature of about 250 degrees Celsius. If the thermal treatment process is performed at a temperature less than 250 degrees Celsius, agglomeration may not occur in the conductive layer 120a such that the particles 121 may not be generated. If the thermal treatment process is performed at a temperature greater than 300 degrees Celsius, the first electrode 110 and the PDL 115 may be damaged or a characteristic of the conductive layer 120a may be poor.

The thermal treatment process may be performed for a time period between about 50 minutes and about 90 minutes. For example, the thermal treatment process may be performed for one hour.

Figure 4E:
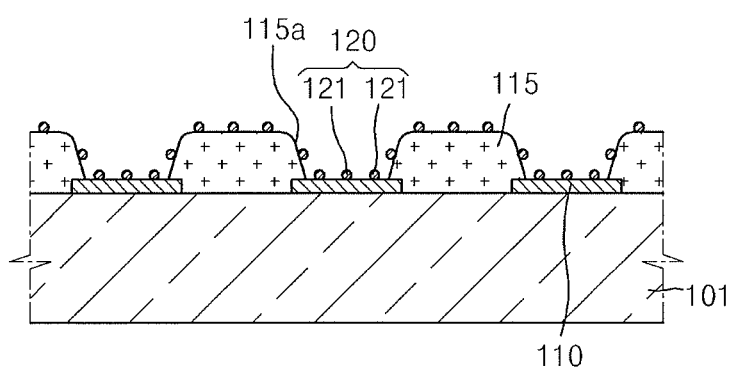

The thermal treatment process may be performed in a nitrogen atmosphere. When the thermal treatment process is complete, as illustrated in FIG. 4E, the particle unit 120 may be formed.

If the conductive layer 120a is thermally treated with the aforementioned conditions, agglomeration may occur in the conductive layer 120a to form the particles 121 that have a predetermined size and are separate from each other.

Figure 4F:
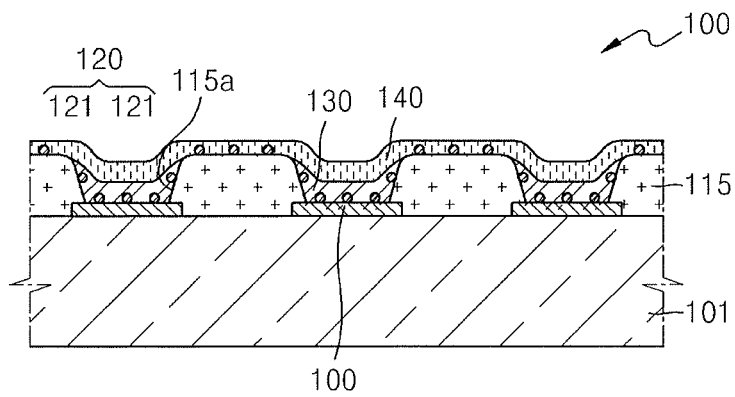

Referring to FIG. 4F, the intermediate layer 130 and the second electrode 140 may be formed on the first electrode 110, so that the organic light-emitting display apparatus 100 is finally manufactured.

The intermediate layer 130 may include an organic emission layer. The intermediate layer 130 may be disposed to correspond to the opening 115a of the PDL 115. The intermediate layer 130 may be disposed on the particles 121 of the particle unit 120 and may contact the first electrode 110 via a space between the particles 121 that are separate from each other.

The second electrode 140 may be disposed on the intermediate layer 130. The second electrode 140 may contact the particles 121 of the particle unit 120. The second electrode 140 may contact predetermined particles 121 from among the particles 121 that do not correspond to the intermediate layer 130.

Although not illustrated, a sealing member (not shown) may be formed on the second electrode 140 so as to face one surface of the substrate 101. The sealing member may be formed to protect the intermediate layers 130 from water or oxygen from outside. The sealing member may be formed of glass or plastic or may have a structure in which a plurality of organic and inorganic materials is stacked.

By using the method of manufacturing the organic light-emitting display apparatus 100, the particle unit 120 that includes the particles 121 may be easily formed on the first electrode 110. Thus, a luminescent efficiency of the organic light-emitting display apparatus may be easily improved.

By way of summation and review, an organic light-emitting display apparatus may include an intermediate layer between a first electrode and a second electrode. The intermediate layer may include an organic emission layer. When a voltage is applied to the first and second electrodes, the organic emission layer emits visible light.

Visible light emitted from an organic emission layer of an intermediate layer included in a typical organic light-emitting display apparatus may be significantly lost before visible light reaches a user. A luminescent efficiency of the organic light-emitting display apparatus may be poor. Accordingly, it may be difficult to improve a display quality of the typical organic light-emitting display apparatus However, according to an organic light-emitting display apparatus and a method of manufacturing the organic light-emitting display apparatus according to the one or more embodiments, a display quality of the organic light-emitting display apparatus may be easily improved.

While embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. An organic light-emitting display apparatus, comprising:
    a substrate;
    a first electrode on the substrate;
    a pixel defining layer on the substrate and on the first electrode, the pixel defining layer including an opening that exposes the first electrode;
    an intermediate layer on the first electrode, the intermediate layer including an organic emission layer;
    a second electrode on the intermediate layer and on the pixel defining layer, and
    a plurality of particles, the plurality of particles including a first set of particles contacting a top surface of the first electrode and the intermediate layer, a second set of particles contacting a side surface of the pixel defining layer and the intermediate layer, and a third set of particles contacting a top surface of the pixel defining layer, contacting the second electrode, and not contacting the intermediate layer.

2. The organic light-emitting display apparatus as claimed in claim 1, wherein a size of the particles of the plurality of particles is from about 300 angstroms to about 1000 angstroms.

3. The organic light-emitting display apparatus as claimed in claim 1, wherein the particles of the plurality of particles include Ag.

4. The organic light-emitting display apparatus as claimed in claim 1, wherein the first electrode includes a transmissive conductive material.

5. The organic light-emitting display apparatus as claimed in claim 4, wherein the transmissive conductive material includes at least one of indium tin oxide (ITO), indium zinc oxide (IZO), zinc oxide (ZnO), indium oxide ($In_2O_3$), indium gallium oxide (IGO), and aluminum zinc oxide (AZO).

6. A method of manufacturing an organic light-emitting display apparatus, the method comprising:
    forming a first electrode on a substrate;
    forming a pixel defining layer on the substrate and on the first electrode, the pixel defining layer including an opening that exposes the first electrode,
    forming a plurality of particles, the plurality of particles including a first set of particles on a top surface of the first electrode, a second set of particles on a side surface and a third set of particles on a top surface of the pixel defining layer;
    forming an intermediate layer including an organic emission layer on the first electrode and the particle unit; and
    forming a second electrode on the intermediate layer, such that the first set of particles contacts the top surface of the first electrode and the intermediate layer, the second set of particles contacts the side surface of the pixel defining layer and the intermediate layer, and the third set of particles contacts the top surface of the pixel defining layer, contacts the second electrode, and does not contact the intermediate layer.

7. The method as claimed in claim 6, wherein the forming of the plurality of particles includes:
    forming a conductive layer that includes Ag; and
    performing a thermal treatment on the conductive layer so as to allow the Ag to agglomerate.

8. The method as claimed in claim 7, wherein a thickness of the conductive layer is about 10 angstroms to about 200 angstroms.

9. The method as claimed in claim 7, wherein the thermal treatment is performed in a nitrogen atmosphere.

10. The method as claimed in claim 7, wherein the thermal treatment is performed at a temperature in a range of about 250 degrees Celsius to about 300 degrees Celsius.

* * * * *